United States Patent
Niemeyer et al.

(10) Patent No.: US 6,197,474 B1
(45) Date of Patent: Mar. 6, 2001

(54) THERMAL COLOR PROOFING PROCESS

(75) Inventors: David A. Niemeyer; Gerard J. Brien, both of Rochester; Charles DeBoer, Palmyra, all of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/603,277

(22) Filed: Jun. 26, 2000

Related U.S. Application Data

(63) Continuation-in-part of application No. 09/384,516, filed on Aug. 27, 1999, now abandoned.

(51) Int. Cl.$^7$ ................. G03F 7/34; G03F 9/00
(52) U.S. Cl. ............ 430/201; 430/200; 430/952; 430/964
(58) Field of Search .................. 430/200, 201, 430/964, 952

(56) References Cited

U.S. PATENT DOCUMENTS

| | | | |
|---|---|---|---|
| 5,126,760 | * | 6/1992 | DeBoer et al. ............... 430/201 |
| 5,225,392 | * | 7/1993 | Chang et al. ............... 430/201 |
| 5,244,770 | * | 9/1993 | DeBoer et al. ............... 430/201 |
| 5,278,023 | * | 1/1994 | Bills et al. ............... 430/201 |
| 5,312,683 | * | 5/1994 | Chou et al. ............... 430/200 |
| 5,318,941 | * | 6/1994 | Ohshima et al. ............... 430/201 |
| 5,401,606 | * | 3/1995 | Reardon et al. ............... 430/200 |
| 5,432,040 | * | 7/1995 | Defieuw ............... 430/201 |
| 5,464,723 | | 11/1995 | Chou ............... 430/200 |
| 5,506,189 | * | 4/1996 | Chou et al. ............... 430/200 |
| 5,538,831 | * | 7/1996 | Oshima et al. ............... 430/201 |
| 5,622,795 | * | 4/1997 | Ellis ............... 430/201 |
| 5,681,681 | * | 10/1997 | Ellis ............... 430/204 |

* cited by examiner

*Primary Examiner*—Richard L. Schilling
(74) *Attorney, Agent, or Firm*—Harold E. Cole

(57) ABSTRACT

A process of forming a halftone color proof containing at least one dye transfer image and at least one pigment transfer image, comprising imagewise-exposing, for less than about $10^{-4}$ sec., by means of a laser having a power density of greater than $10^4$ W/cm$^2$, a dye-donor element comprising a support having thereon a dye layer comprising a dye dispersed in a polymeric binder, the dye layer having an infrared-absorbing material associated therewith, the laser exposure taking place through the side of the support of the dye-donor element which does not have the dye layer thereon, and transferring a portion of the dye in the dye layer to a receiving element having thereon an image-receiving layer; and imagewise-exposing, for less than about $10^{-4}$ sec., by means of the laser, an ablative or propulsive pigment-donor element comprising a support having thereon a transfer layer comprising a pigment dispersed in a binder, the transfer layer having an infrared-absorbing material associated therewith, the laser exposure taking place through the side of the support of the pigment-donor element which does not have the transfer layer thereon, and transferring a pigment image to the receiving element to obtain the halftone color proof.

8 Claims, No Drawings

THERMAL COLOR PROOFING PROCESS

This application is a continuation-in-part of application Ser. No. 09/384,516, filed Aug. 27, 1999, now abandoned.

FIELD OF THE INVENTION

This invention relates to use of a process for obtaining a halftone color proof that better represents the color gamut of a color image obtained from a printing press.

BACKGROUND OF THE INVENTION

In order to approximate the appearance of continuous-tone (photographic) images via ink-on-paper printing, the commercial printing industry relies on a process known as halftone printing. In halftone printing, color density gradations are produced by printing patterns of dots or areas of varying sizes, but of the same color density, instead of varying the color density continuously as is done in photographic printing.

There is an important commercial need to obtain a color proof image before a printing press run is made. It is desired that the color proof will accurately represent at least the details and color tone scale of the prints obtained on the printing press. In many cases, it is also desirable that the color proof accurately represent the image quality and halftone pattern of the prints obtained on the printing press. In the sequence of operations necessary to produce an ink-printed, full-color picture, a proof is also required to check the accuracy of the color separation data from which the final three or more printing plates or cylinders are made. Traditionally, such color separation proofs have involved silver halide photographic, high-contrast lithographic systems or non-silver halide light-sensitive systems which require many exposure and processing steps before a final, full-color picture is assembled.

There is also an important commercial need to obtain a halftone color proof directly from digital color separation data.

In order to produce a halftone pattern, the process used must be capable of high resolution, i.e., at least 60 pixels/mm. To achieve that resolution, the process must be, locally, adiabatic, with no or little thermal flow to surrounding areas. Localized temperatures in these processes will range from about 500° C. to over 1500° C. using a laser.

Well known thermal transfer processes which employ an array of resistive heating elements as the imaging source are, locally, isothermal, which involves thermal flow to surrounding areas. Being isothermal, these processes lack the resolution for producing an accurate halftone color proof.

In U.S. Pat. No. 5,126,760, a process is described for producing a direct digital, halftone color proof of an original image on a dye-receiving element. The proof can then be used to represent a printed color image obtained from a printing press. The process described therein comprises:

a) generating a set of electrical signals which is representative of the shape and color scale of an original image;

b) contacting a dye-donor element comprising a support having thereon a dye layer and an infrared-absorbing material with a first dye-receiving element comprising a support having thereon a polymeric, dye image-receiving layer;

c) using the signals to imagewise-heat by means of a diode laser the dye-donor element, thereby transferring a dye image to the first dye-receiving element; and d) retransferring the dye image to a second dye image-receiving element which has the same substrate as the printed color image.

In the above process, multiple dye-donors are used to obtain a range of colors in the proof. For example, for a full-color proof, four colors: cyan, magenta, yellow and black are normally used.

By using the above process, the image dye is transferred by heating the dye-donor containing the infrared-absorbing material with the diode laser to volatilize the dye, the diode laser beam being modulated by the set of signals which is representative of the shape and color of the original image, so that the dye is heated to cause volatilization only in those areas in which its presence is required on the dye-receiving layer to reconstruct the original image.

In color proofing in the printing industry, it is important to be able to match the proofing ink references provided by the International Prepress Proofing Association. These ink references are density patches made with standard 4-color process inks and are known as SWOP® (Specifications Web Offset Publications) color aims. For additional information on color measurement of inks for web offset proofing, see "Advances in Printing Science and Technology", Proceedings of the 19th International Conference of Printing Research Institutes, Eisenstadt, Austria, June 1987, J. T. Ling and R. Warner, p.55.

Although a wide gamut of printing ink colors can be matched by just a few dye-donor elements, there are certain types of inks used in the printing industry which cannot be matched by any combination of dyes. Notable among these types of pigments are the metallics, white and opaque spot colorants.

In U.S. Pat. No. 5,278,023, there is disclosed a propellant-containing laser thermal transfer donor element which is used to mass transfer pigments or dyes to a receiver element. However, there is no indication that only a portion of dye from a dye-donor element could be transferred in combination with a mass transfer of a pigment layer.

In U.S. Pat. No. 5,464,723, a process is described using thermal mass transfer of a white or metallic donor layer followed by a thermally transferred dye image. However, there is a problem with this process as it employs an array of resistive heating elements as the imaging source which are isothermal, involving thermal flow to surrounding areas. Therefore, this processes lacks the resolution for producing an accurate halftone color proof.

It is an object of this invention to provide a halftone color proof that better represents the color gamut of a color image obtained from a printing press.

SUMMARY OF THE INVENTION

These and other objects are obtained by this invention which relates to a process of forming a halftone color proof containing at least one dye transfer image and at least one pigment transfer image, comprising imagewise-exposing, for less than about $10^{-4}$ sec., by means of a laser having a power density of greater than $10^4$ W/cm$^2$, a dye-donor element comprising a support having thereon a dye layer comprising a dye dispersed in a polymeric binder, the dye layer having an infrared-absorbing material associated therewith, the laser exposure taking place through the side of the support of the dye-donor element which does not have the dye layer thereon, and transferring a portion of the dye in the dye layer to a receiving element having thereon an image-receiving layer; and imagewise-exposing, for less than about $10^{-4}$ sec., by means of the laser, an ablative or propulsive pigment-donor element comprising a support having thereon a transfer layer comprising a pigment dispersed in a binder, the transfer layer having an infrared-absorbing material associated therewith, the laser exposure taking place through the side of the support of the pigment-donor element which does not have the transfer layer thereon, and transferring a pigment image to the receiving element to obtain the halftone color proof.

By use of this invention, a wide gamut of colors can be obtained in a color proof since a dye-donor element is used in which only a portion of the dye is transferred according to the desired hue to be reproduced. For example, different shades of gold can be reproduced using the invention. In contrast thereto, donor elements which exclusively use mass transfer of colorants are limited in color gamut since the amount of colorant transferred cannot be easily varied. For example, only one shade of gold can be reproduced which depends on the pigment used.

DETAILED DESCRIPTION OF THE INVENTION

In a preferred embodiment of the invention, pigment image is transferred adjacent to the dye image. In this case, the pigment image can be used to provide a "spot" color. In another preferred embodiment, the pigment image is transferred on top of the dye image. In yet another preferred embodiment, the dye image is transferred on top of the pigment image. In still another preferred embodiment, the pigment is aluminum flake, one of the dye layers contains a magenta dye and another dye layer contains a yellow dye, the imagewise transfer of the dye layers to the receiver element takes place first, followed by transfer of the aluminum flake on top of the dye layer to obtain a metallic-gold appearing color proof.

In the above process, the order of transfer of dye or pigment to the receiver can be varied, as desired.

The pigment transfer process described above can be thought of as mass transfer mode of imaging using the action of a laser beam. The pigment-donor element with a transfer layer comprising a pigment and a binder coated onto a substrate is imaged from the substrate side. A laser light absorbing material can be incorporated within the transfer layer or in an underlying layer such as a propellant layer or heater layer. The energy provided by the laser results in a completely physical displacement which causes an almost complete transfer of the pigment rather than a partial transfer.

The dyes or pigments in the donors employed in the invention are dispersed in a binder such as a cellulose derivative, e.g., cellulose acetate hydrogen phthalate, cellulose acetate, cellulose acetate propionate, cellulose acetate butyrate, cellulose triacetate or any of the materials described in U.S. Pat. No. 4,700,207; a polycarbonate; poly(vinyl acetate); poly(styrene-co-acrylonitrile); a polysulfone or a poly(phenylene oxide). The binder may be used at a coverage of from about 0.1 to about 5 g/m².

The dye layer of the dye-donor element or transfer layer of the pigment-donor element may be coated on the support or printed thereon by a printing technique such as a gravure process.

Any material can be used as the support for the dye-donor element or pigment-donor element employed in the invention provided it is dimensionally stable and can withstand the heat of the laser or thermal head. Such materials include polyesters such as poly(ethylene terephthalate); polyamides; polycarbonates; cellulose esters such as cellulose acetate; fluorine polymers such as poly(vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. It may also be coated with a subbing layer, if desired, such as those materials described in U.S. Pat. Nos. 4,695,288 or 4,737,486.

The receiving element that is used with the donor elements employed in the invention usually comprises a support having thereon a dye image-receiving layer. The support may be a transparent film such as a poly(ether sulfone), a polyimide, a cellulose ester such as cellulose acetate, a poly(vinyl alcohol-co-acetal) or a poly(ethylene terephthalate). The support for the receiving element may also be reflective such as baryta-coated paper, polyethylene-coated paper, an ivory paper, a condenser paper or a synthetic paper such as DuPont Tyvek®. Pigmented supports such as white polyester (transparent polyester with white pigment incorporated therein) may also be used.

The image-receiving layer may comprise, for example, a polycarbonate, a polyurethane, a polyester, poly(vinyl chloride), poly(styrene-co-acrylonitrile), polycaprolactone, a poly(vinyl acetal) such as poly(vinyl alcohol-co-butyral), poly(vinyl alcohol-co-benzal), poly(vinyl alcohol-co-acetal) or mixtures thereof. The image-receiving layer may be present in any amount which is effective for the intended purpose. In general, good results have been obtained at a concentration of from about 1 to about 5 g/m².

Pigments which can be used in the invention include the following: organic pigments such as metal phthalocyanines, e.g., copper phthalocyanine, quinacridones, epindolidiones, Rubine F6B (C.I. No. Pigment 184); Cromophthal® Yellow 3G (C.I. No. Pigment Yellow 93); Hostaperm® Yellow 3G (C.I. No. Pigment Yellow 154); Monastral® Violet R (C.I. No. Pigment Violet 19); 2,9-dimethylquinacridone (C.I. No. Pigment Red 122); Indofast® Brilliant Scarlet R6300 (C.I. No. Pigment Red 123); Quindo Magenta RV 6803; Monstral® Blue G (C.I. No. Pigment Blue 15); Monstral® Blue BT 383D (C.I. No. Pigment Blue 15); Monstral® Blue G BT 284D (C.I. No. Pigment Blue 15); Monstral® Green GT 751D (C.I. No. Pigment Green 7) or any of the materials disclosed in U.S. Pat. Nos. 5,171,650, 5,672,458 or 5,516,622, the disclosures of which are hereby incorporated by reference.

Dyes useful in the invention include the following: Anthraquinone dyes, e.g., Sumikaron Violet RS® (product of Sumitomo Chemical Co., Ltd.), Dianix Fast Violet 3R-FS® (product of Mitsubishi Chemical Industries, Ltd.), and Kayalon Polyol Brilliant Blue N-BGM®, and KST Black 146® (products of Nippon Kayaku Co., Ltd.); azo dyes such as Kayalon Polyol Brilliant Blue BM®, Kayalon Polyol Dark Blue 2BM®, and KST Black KR® (products of Nippon Kayaku Co., Ltd.), Sumikaron Diazo Black 5G® (product of Sumitomo Chemical Co., Ltd.), and Miktazol Black 5GH® (product of Mitsui Toatsu Chemicals, Inc.); direct dyes such as Direct Dark Green B® (product of Mitsubishi Chemical Industries, Ltd.) and Direct Brown M® and Direct Fast Black D® (products of Nippon Kayaku Co. Ltd.); acid dyes such as Kayanol Milling Cyanine 5R® (product of Nippon Kayaku Co. Ltd.); basic dyes such as Sumiacryl Blue 6G® (product of Sumitomo Chemical Co., Ltd.), and Aizen Malachite Greene® (product of Hodogaya Chemical Co., Ltd.); or any of the dyes disclosed in U.S. Pat. Nos. 4,541,830; 4,698,651; 4,695,287; 4,701,439; 4,757,046; 4,743,582; 4,769,360 and 4,753,922, the disclosures of which are hereby incorporated by reference. The above dyes or pigments may be employed singly or in combination.

The dyes and pigments used in the invention may be employed at a coverage of from about 0.02 to about 2 g/m².

The process of obtaining a dye image with the dye-donor elements employed in this invention has been described in U.S. Pat. No. 5,126,760 and is conveniently obtained on commercially-available laser thermal proofing systems such as the Kodak Approval® system, or the Creo Trendsetter® Spectrum system. Typically, a receiver sheet is placed on a rotating drum followed by successive placements of the individual cyan, magenta, yellow and black donor elements whereby the image for each color is transferred by imagewise exposure of the laser beam through the backside of the donor element.

As noted above a laser is used to transfer dye from the dye-donor elements and pigment-donor elements used in the invention. It is preferred to use a diode laser since it offers substantial advantages in terms of its small size, low cost, stability, reliability, ruggedness, and ease of modulation. In practice, before any laser can be used to heat a donor element, the element must contain an absorbing material which absorbs at the emitting wavelength of the laser. The infrared-absorbing material may be present in the dye or pigment layer or in a layer adjacent thereto. Infrared-absorbing materials which may be used include carbon black, cyanine infrared-absorbing dyes as described in U.S. Pat. No. 4,973,572, or other materials as described in the following U.S. Pat. Nos. 4,948,777; 4,950,640; 4,950,639; 4,948,776; 4,948,778; 4,942,141; 4,952,552; 5,036,040; and 4,912,083, the disclosures of which are hereby incorporated by reference.

Lasers which can be used to transfer dye or pigment from donors employed in the invention are available commercially. There can be employed, for example, Laser Model SDL-2420-H2 from Spectra Diode Labs, or Laser Model SLD 304 V/W from Sony Corp. These lasers are capable of producing the greater than $10^4$ W/cm$^2$ power density necessary for halftone imaging.

A thermal printer which uses the laser described above to form an image on a thermal print medium is described and claimed in U.S. Pat. No. 5,268,708, the disclosure of which is hereby incorporated by reference.

Spacer beads may be employed in a separate layer over the dye layer of the dye-donor or transfer layer of the pigment-donor element in the above-described laser process in order to separate the dye-donor from the dye-receiver during dye transfer, thereby increasing the uniformity and density of the transferred image. That invention is more fully described in U.S. Pat. No. 4,772,582, the disclosure of which is hereby incorporated by reference. Alternatively, the spacer beads may be employed in the receiving layer of the dye-receiver as described in U.S. Pat. No. 4,876,235, the disclosure of which is hereby incorporated by reference. The spacer beads may be coated with a polymeric binder if desired.

The use of an intermediate receiver with subsequent retransfer to a second receiving element may also be employed in the invention. A multitude of different substrates can be used to prepare the color proof (the second receiver) which is preferably the same substrate as that used for the printing press run.

Thus, this one intermediate receiver can be optimized for efficient dye uptake without dye-smearing or crystallization.

Examples of substrates which may be used for the second receiving element (color proof) include the following: Flo Kote Cover® (S. D. Warren Co.), Champion Textweb® (Champion Paper Co.), Quintessence Gloss® (Potlatch Inc.), Vintage Gloss® (Potlatch Inc.), Khrome Kote® (Champion Paper Co.), Consolith Gloss® (Consolidated Papers Co.), Ad-Proof Paper® (Appleton Papers, Inc.) and Mountie Matte® (Potlatch Inc.).

As noted above, after an image is obtained on a first receiving element, it may be retransferred to a second image-receiving element. This can be accomplished, for example, by passing the two receivers between a pair of heated rollers. Other methods of retransferring the image could also be used such as using a heated platen, use of pressure and heat, external heating, etc.

Also as noted above, in making a color proof, a set of electrical signals is generated which is representative of the shape and color of an original image. This can be done, for example, by scanning an original image, filtering the image to separate it into the desired additive primary colors, i.e., red, blue and green, and then converting the light energy into electrical energy. The electrical signals are then modified by computer to form the color separation data which are used to form a halftone color proof. Instead of scanning an original object to obtain the electrical signals, the signals may also be generated by computer. This process is described more fully in *Graphic Arts Manual*, Janet Field ed., Arno Press, New York 1980 (p. 358ff), the disclosure of which is hereby incorporated by reference.

The following example is provided to illustrate the invention.

EXAMPLE

A pigment propulsive donor was prepared by coating onto a sheet of 100 μm poly(ethylene terephthalate) the following layers:

1) 21.5 cc/m$^2$ of a solution of 20 parts poly(methyl cyanoacrylate-co-ethyl cyanoacrylate) (methyl:ethyl= 3:1) and 3 parts 2-{2-(2-chloro-3-((1,3-dihydro-1,1,3-trimethyl-2H-benz(e)indol-2-ylidene)ethylidene)-1-cyclohexen-1-yl)ethenyl}-1,1,3-trimethyl-1H-benz(e) indolium salt with heptafluorobutanoic acid (1:1) dissolved in 7.4 parts methanol and 1870 parts cyclopentanone, and 2) 6.03 cc/m$^2$ of a dispersion of 41.7 parts Superfine® P-7 Aluminum Paste (Silberline Manufacturing Co.) in 462 parts of a solution of 29 parts of the glycerol ester of partially-hydrogenated wood rosin, Staybelite Ester 10® (Hercules Co.), 7.2 parts polyethylmethacrylate, Elvacite 2043® (ICI Americas Co.), and 2.0 parts of a surfactant, DC-510® Dow Corning) dissolved in 425 parts toluene. The first coating was air dried at room temperature prior to the second coating.

Images were written on an external drum device using an 830 nm wavelength laser diode array with a centerline spacing of 10 μm between individual laser lines. Exposures were varied by changing power output at a linear velocity of 1550 cm/sec. Images were written to KODAK APPROVAL® Digital Color Proofing Film I01/Intermediate/1834 available from Kodak Polychrome Graphics. An image was prepared by sequentially writing, first, KODAK APPROVAL® Digital Color Proofing Film DY01/Yellow Donor/1831, a dye sublimation donor available from Kodak Polychrome Graphics, at 213 mJ/cm$^2$, second, KODAK APPROVAL® Digital Color Proofing Film DM01/Magenta Donor/1871, a dye sublimation donor available from Kodak Polychrome Graphics, at 219 mJ/cm$^2$ and, third, the laser propulsive donor described above at 258 mJ/cm$^2$. The image along with the uppermost layer of the intermediate was then laminated to the final receiver by means of a two roll laminator operating at 5.08 mm/sec and an average roller temperature of 120° C.

A metallic appearing gold color was produced which could not be obtained using the normal Kodak APPROVAL® dye donor elements, thus increasing the color gamut obtained.

The invention has been described in detail with particular reference to preferred embodiments thereof, but it will be understood that variations and modifications can be effected within the spirit and scope of the invention.

What is claimed is:

1. A process of forming a halftone color proof containing at least one dye transfer image and at least one pigment transfer image, comprising imagewise-exposing, for less than about $10^{-4}$ sec., by means of a laser having a power density of greater than $10^4$ W/cm$^2$, a dye-donor element comprising a support having thereon a dye layer comprising a dye dispersed in a polymeric binder, said dye layer having an infrared-absorbing material associated therewith, said laser exposure taking place through the side of said support of said dye-donor element which does not have said dye layer thereon, and transferring a portion of said dye in said dye layer to a receiving element having thereon an image-receiving layer; and imagewise-exposing, for less than about $10^{-4}$ sec., by means of said laser, an ablative or propulsive pigment-donor element comprising a support having thereon a transfer layer comprising a pigment dispersed in a binder, said transfer layer having an infrared-absorbing material associated therewith, said laser exposure taking place through the side of said support of said pigment-donor element which does not have said transfer layer thereon, and transferring a pigment image to said receiving element to obtain said halftone color proof.

2. The process of claim 1 wherein said pigment image is transferred adjacent to said dye image.

3. The process of claim 1 wherein said pigment image is transferred on top of said dye image.

4. The process of claim 1 wherein said dye image is transferred on top of said pigment image.

5. The process of claim 1 wherein said pigment is aluminum flake.

6. The process of claim 1 wherein said image on said receiving element is further transferred to a final receiver element.

7. The process of claim 6 wherein said pigment is aluminum flake, one of said dye layers contains a magenta dye and another of said dye layers contains a yellow dye, said imagewise transfer of said dye layers to said receiver element takes place first, followed by transfer of said aluminum flake on top of said dye layer to obtain a metallic-gold appearing color proof.

8. The process of claim 1 wherein said ablative or propulsive pigment-donor element comprises a propellant layer between said support and said transfer layer.

* * * * *